United States Patent

Hsu et al.

[11] Patent Number: 6,025,734
[45] Date of Patent: Feb. 15, 2000

[54] METHOD OF MONITORING ION CONTAMINATION IN INTEGRATED CIRCUITS

[75] Inventors: Chao-Shuenn Hsu; Ming-Dar Liu, both of Tainan Hsien, Taiwan

[73] Assignee: Winbond Electronics Corporation, Taiwan

[21] Appl. No.: 08/995,310

[22] Filed: Dec. 22, 1997

[30] Foreign Application Priority Data

Oct. 13, 1997 [TW] Taiwan ................................ 86114970

[51] Int. Cl.⁷ .................................................. G01R 31/26
[52] U.S. Cl. .......................... 324/769; 324/71.1; 324/765
[58] Field of Search ................................ 324/71.1, 765, 324/766, 767, 769; 438/15, 17, 18

[56] References Cited

U.S. PATENT DOCUMENTS

| | | | |
|---|---|---|---|
| 4,950,977 | 8/1990 | Garcia et al. | 324/71.1 |
| 4,963,500 | 10/1990 | Cogan et al. | 438/16 |
| 4,978,915 | 12/1990 | Andrews, Jr. et al. | 324/765 |
| 5,498,974 | 3/1996 | Verkuil et al. | 324/767 |

*Primary Examiner*—Josie Ballato
*Assistant Examiner*—Russell M. Kobert
*Attorney, Agent, or Firm*—Fish & Richardson P.C.

[57] ABSTRACT

A method of monitoring ion contamination in integrated circuits is disclosed. The method makes use of the electric field induced by bias voltages and the heating circuit provided in the integrated circuit to raise temperature in order to drive mobile ions into or out of the gate oxide layer of a MOS transistor. Then, the threshold voltages of the MOS transistor under different ion contamination are measured respectively. The ion contamination induced whether in front-end process or back-end process can be detected properly.

7 Claims, 2 Drawing Sheets

METHOD OF MONITORING ION CONTAMINATION IN INTEGRATED CIRCUITS

BACKGROUND OF THE INVENTION

1. Field of the Invention

The present invention generally relates to a method of testing integrated circuits. More particular, the present invention relates to a method of monitoring ion contamination in MOS integrated circuits. By providing steady voltage biases and high temperature, the mobile ions are driven into or out of the gate oxide layers of MOS transistors in integrated circuits. The threshold voltages of MOS transistors are measured. Therefore, the situation that an integrated circuit is contaminated by ions can be reflected.

2. Description of the Related Art

MOS devices have been widely applied for fabricating and designing integrated circuits, because of the features of their low power dissipation and high integrity. During the process of fabricating semiconductor integrated circuits, the integrated circuits are inevitably be contaminated by ions, such that the performance and characteristic of MOS transistors are degraded. For a MOS transistor in an integrated circuit, if its gate oxide is contaminated by ions, then the threshold voltage will deviate from the original designed value, resulting in error operation. Taking static random access memory (SRAM) for example, a SRMA cell comprises at least four NMOS transistors formed in a P type substrate. If any NMOS transistor in the cell is contaminated by ions, then, when the cell works in steady bias voltage, the ions will be driven toward the region beneath the gate oxide layer, resulting in flat band voltage drifting. Therefore, the threshold voltage of an NMOS transistor is reduced, and the data stored in the SRAM cell are lost easily.

At present, two analysis methods, B-T-S-CV and SIMS, are used for examining the above issues. However, the above methods can not reflect the characteristics of MOS devices directly. Furthermore, the C-V (capacitance-voltage) characteristic is tested through test keys of MOS devices, after completing integrated circuits. However, the ion contamination induced in the processes after forming gates of MOS transistors can not be reflected accurately.

SUMMARY OF THE INVENTION

Accordingly, the object of the present invention is to overcome the above problems and provide a method of monitoring ion contamination induced during fabrication process. According to the present invention, the MOS transistors in an integrated circuit are biased, and the mobile ions are moved to the gates of MOS transistors due to the electric field induced by the bias voltage. In addition, a heating circuit made of low-doped polysilicon is provided in every tested integrated circuit to raise the temperature and accelerate the drifting speed of the mobile ions. Therefore, the ion contamination can be reflected by measuring the threshold voltage deviation of a MOS transistor.

The present invention makes use of heating circuit disposed in integrated circuits and the metal layers (aluminum, for example) for biasing some MOS transistor in integrated circuit without changing the dimensions, circuits, and fabrication process to detect ion contamination. Consequently, the ion contamination whether induced in the front-end or back-end process can be reflected accurately.

In accordance with the present invention, the method of monitoring ion contamination in integrated circuits is described as follows.

First, a MOS integrated circuit is provided. The integrated circuit is heated and the gate of the MOS transistor is forward biased for a determined time interval, such that the mobile ions in the gate moving into the gate oxide layer thereof. Next, after removing the gate bias voltage, a first threshold voltage of the MOS transistor is measured at room temperature. The integrated circuit is heat again and the gate of the MOS transistor is reversely biased for a determined time interval to expel the ions in the gate oxide layer. Finally, after removing the gate bias voltage, a second threshold voltage of the MOS transistor is measured at room temperature. The MOS integrated circuit contaminated by ions in the front-end process is detected by comparing the first and second threshold voltages.

The MOS integrated circuit contaminated by ions in the back-end process can be reflected according to the process described as follows.

First, a MOS integrated circuit is provided. Next, the integrated circuit is heated to a temperature and the metal layer of the integrated circuit is forward biased for a determined time interval. Therefore, the mobile ions, which distribute in the metal layer and the region between the metal layer and the gate, are driven closely to the gate oxide layer. Keeping the temperature of the integrated circuit, the gate of the MOS transistor is forward biased to drive the mobile ions into the gate oxide layer deeply. Next, after removing the gate bias, a first threshold voltage of the MOS transistor is measured at room temperature. Then, the integrated circuit is heated and the gate of the MOS transistor is reversely biased for a determined time interval to drive the ions out of the gate oxide layer. Finally, after removing the gate bias voltage, a second threshold voltage of the MOS transistor is measured at room temperature. Therefore, the MOS integrated circuit contaminated by ions in the back-end process is detected by comparing the first and second threshold voltages.

Before carrying out the above method, the initial threshold voltage is also measured at room temperature. When the steps of the method are completed, the integrated circuit is heated for a recovery time interval to diffuse the ions out of the gate oxide layer, and then the final threshold voltage is measured at room temperature. The final threshold voltage is compared with the initial threshold voltage, and the recovery ability of the MOS transistor after being contaminated by ions is reflected.

BRIEF DESCRIPTION OF THE DRAWINGS

Other objects, features and advantages of the present invention will become apparent by way of the following detailed description of the preferred but non-limiting embodiment. The description is made with reference to the accompanying the following drawings.

DETAILED DESCRIPTIONS OF THE INVENTION

Figure 1:
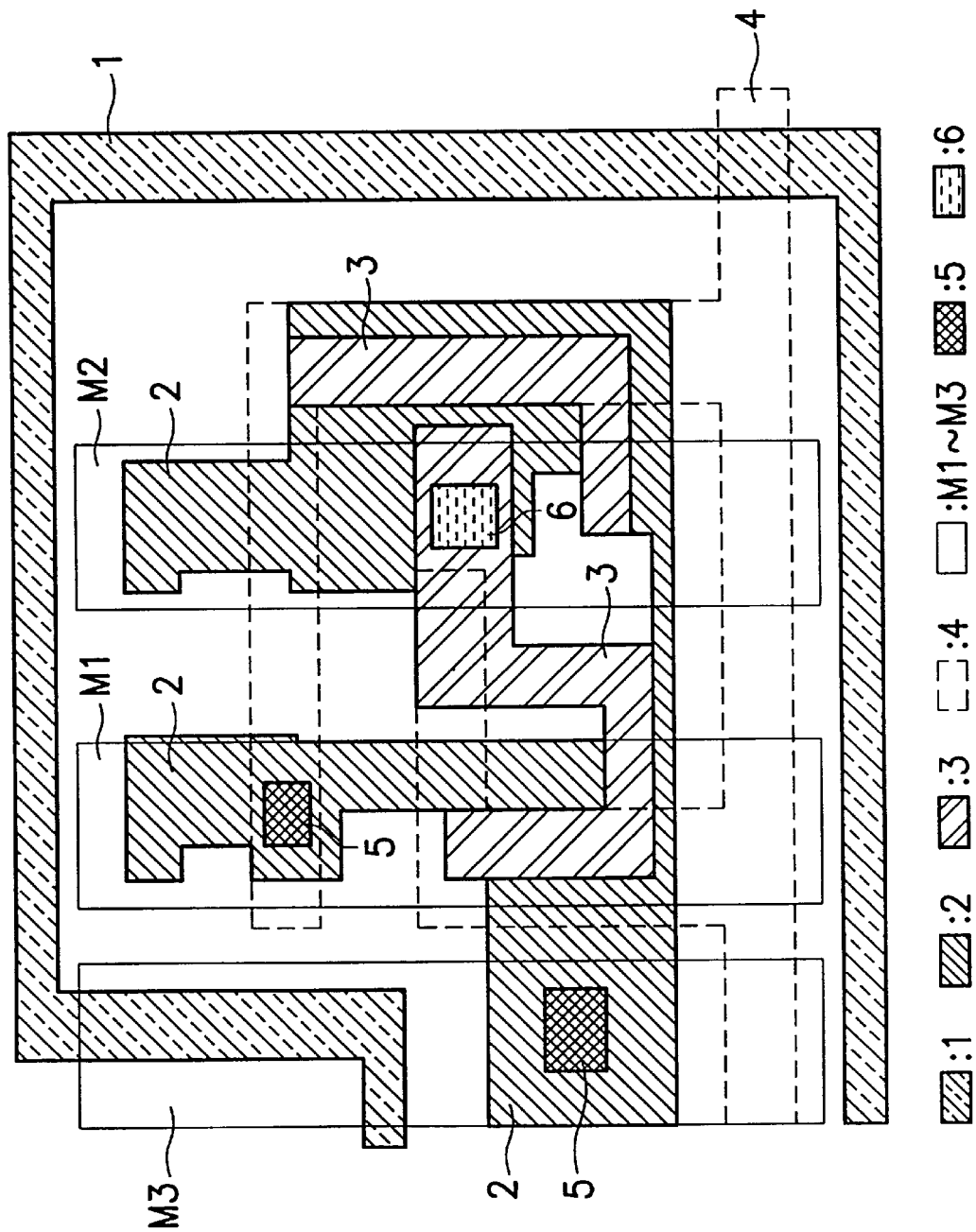
FIG. 1 illustrates a test-key layout of a SRAM cell with a heating circuit.
Figure 2:
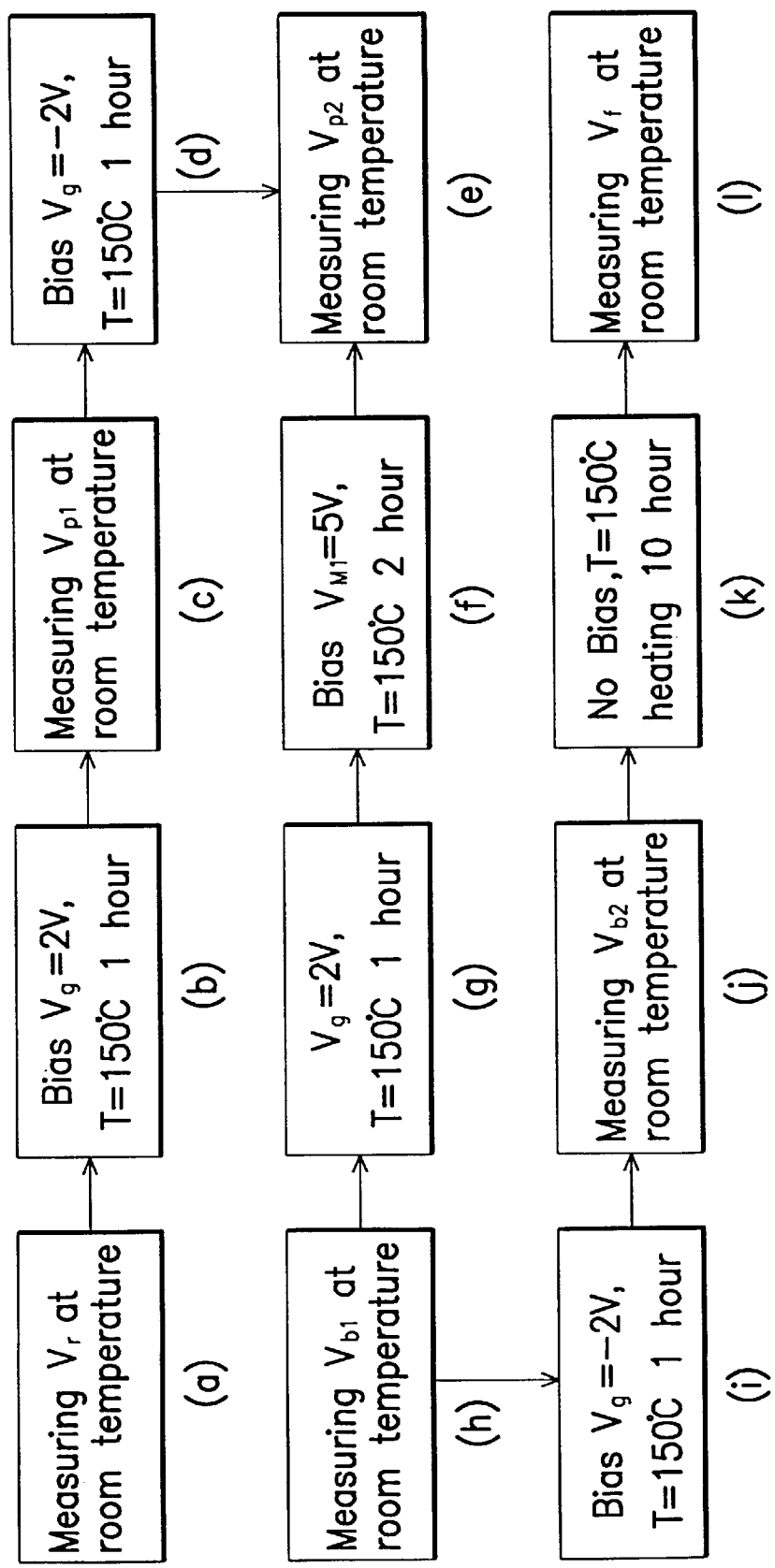
FIG. 2 illustrates a flow chart of the monitoring method according the present invention.

FIG. 1 illustrates a test-key layout of a SRAM cell with a heating circuit. In FIG. 1, numeral 1 is a heating circuit (heater) which is a resistor made of low-doped polysilicon, for example. The resistor (heating circuit 1) has high resistance about several GΩ/sq. Numeral 2 is an active region, and numeral 3 is a first polysilicon layer. Numeral 4 is a second polysilicon layer, and numeral 5 is polysilicon contact (that is, the contact of the active region 2 and the metal layer M3). Numeral 7 is the contact of the first polysilicon layer 3 and the metal layer M2. The flow chart of the monitoring method according the present invention is shown in FIG. 2. The process flow will be described as follows. The method of monitoring ion contamination will be described hereinafter, referring to FIG. 1 and FIG. 2.

Step (a)

The P-type substrate of a SRAM cell is grounded and a threshold voltage of an NMOS transistor in the cell is measured, serving as a reference threshold voltage Vr.

Step (b)

Two terminals of the heating circuit 1 are connected to a bias voltage source to raise the temperature of the integrated circuit to about 150° C. A bias voltage 2 V is fed the metal layer M3 and polysilicon contact 5 to forward bias the gate of the NMOS transistor (that is, $V_g \cong 2$ V). The situation is kept for 1 hour. Therefore, the mobile ions distributed in the gate of the NMOS transistor are driven toward the regions of the gate oxide layer and substrate interface.

Step (c)

The bias voltage of the heater 1 is removed and the threshold voltage $V_{p1}$ of the NMOS transistor is measured at room temperature. The threshold voltage $V_{p1}$ is the threshold voltage of the NMOS transistor contaminated by ions.

Step (d)

Two terminals of the heating circuit 1 are connected to a bias voltage source to raise the temperature of the integrated circuit to about 150° C. A bias voltage 2 V is fed to the metal layer M3 and polysilicon contact 5 to reversely bias the gate of the NMOS transistor (that is, $V_g=-2$ V). The situation is kept for 1 hour. Therefore, the mobile ions distributed in gate oxide are driven out. The mobile ions, which are driven into the gate oxide layer in step (b), are expelled out of the gate oxide layer and the ion contamination is reduced.

Step (e)

The bias voltage of the heating circuit 1 is removed and the threshold voltage $V_{p2}$ of the NMOS transistor is measured at room temperature. The threshold voltage $V_{p2}$ are compared with the threshold voltage $V_{p1}$ measured in step (c), and the difference between $V_{p1}$ and $V_{p2}$ can reflected the ion contamination to the gate oxide layer. Consequently, the ion contamination induced in the front-end process is detected.

Furthermore, the ion contamination induced in the back-end process can also be detected, if the following steps are carried out.

Step (f)

The integrated circuit is heated and the temperature rises to about 150° C. A bias voltage 5 V is fed to bias the metal layer M1 for 2 hours, that is, $V_{M1}$ is about 5 V. A dielectric layer is formed between the metal layer M1 and the gate. By the biasing voltage of 5 V, the mobile ions, among the metal layer, dielectric layer, and gate, are forced to move toward the gate.

Step (g)

The integrated circuit is kept at the temperature of 150° C., and the gate of the NMOS transistor are biased with a voltage of 2 V ($V_g=2$ V). The ions, which are driven into the gate in step (f), and the original mobile ions in the gate are further driven toward the gate oxide layer. Therefore, the ion contamination of the NMOS transistor due to all possible ions is induced.

Step (h)

The threshold voltage $V_{b1}$ of the NMOS transistor is measured at room temperature.

Step (i)

The gate of the NMOS transistor is reversely biased with a voltage of 2 V ($V_g=-2$ V), and the integrated circuit is heated to raise the temperature to about 150° C. for an hour to expel the ions in the gate oxide layer.

Step (j)

The threshold voltage $V_{b2}$ is measured at room temperature. Because the mobile ions are expelled out of the gate oxide layer, the threshold voltage is not disturbed and deviated by ion contamination.

Step (k)

The temperature is raised to 150° C. for about 10 hours, such that the mobile ions can distribute uniformly in the gate or even diffuse out of the gate.

Step (l)

Finally, the threshold voltage $V_f$ of the NMOS transistor is measured. The threshold voltage $V_f$ may be close to the threshold voltage $V_r$ measured in step (a).

In the step (c), the threshold voltage $V_{p1}$ is measured in the case that the gate oxide layer is contaminated. In the step (e), the threshold voltage $V_{p2}$ is measured in the case that the gate oxide layer is not contaminated (because the mobile ions have been driven out by using reverse-bias voltage). In the front-end process, the gate oxide layer merely could be contaminated due the mobile ions from the polysilicon gate. Therefore, the ion contamination can be reflected by comparing $V_{p1}$ with $V_{p2}$.

In the steps (f) and (g), the mobile ions in the dielectric layer and the gate of the NMOS transistor are driven into the gate oxide layer. Therefore, the threshold voltage $V_{b1}$ measured in step (h) are compared with the threshold voltage $V_{b2}$ measured in step (j), and the ion contamination induced during front-end and back-end processes can be reflected. In addition, the ion contamination induced in back-end process is responded by comparing the threshold voltages $V_{b1}$ and $V_{p1}$.

Furthermore, in steps (k) and (l), the threshold voltage is recovered to a threshold voltage $V_f$ of no ion contamination. The recovery state of the NMOS transistor from ion contamination can be obtained by comparing the initial threshold voltage $V_r$ and the threshold voltage $V_f$. The data can provide a basis for analyzing error function.

From the above mentioned, the present invention can properly reflected the ion contamination problems in semiconductor process, and reference data obtained during the testing steps can provide engineers more bases for improving process and analyzing error functions.

The NMOS transistor of a SRAM cell described here in this embodiment serves as an example. The method according to the present invention is not limited to only apply to a SRAM cell. Any integrated circuit the cell of which has a heating circuit enclosed the cell as shown in FIG. 2, can be tested by the present invention. If the integrated circuits with PMOS transistors are tested, then the N substrates of the PMOS transistor are connected to a positive voltage first. Then the PMOS transistors are tested following the above steps, wherein the corresponding bias voltages in the above steps are reversed.

While the invention has been described in terms of what is presently considered to be three most practical and preferred embodiments, it is to be understood that the invention need not be limited to the disclosed embodiments. Conversely, it is intended to cover various modifications and similar arrangements included within the spirit and scope of the appended claims, the scope of which should be accorded the broadest interpretation so as to encompass all such modifications and similar structures.

What is claimed is:

1. A method of monitoring ion contamination in integrated circuits, comprising the steps:

providing a MOS integrated circuit;

heating said integrated circuit and forward-biasing the gate of a MOS transistor in said integrated circuit for a determined time interval to drive the mobile ions in the gate into gate oxide layer;

removing gate bias voltage and measuring a first threshold voltage of said MOS transistor at room temperature;

heating said integrated circuit and reverse-biasing the gate of said MOS transistor for a determined time interval to drive the ions out of said gate oxide layer; and removing gate bias voltage and measuring a second threshold voltage of said MOS transistor at room temperature, and the ion contamination of said MOS integrated circuit induced in the front-end process can be reflected by comparing said first threshold voltage with said second threshold voltage.

2. The method as claimed in claim 1, wherein heating circuits are provided in said integrated circuit for heating said integrated circuit, and said heating circuits are resistors with high resistance.

3. The method as claimed in claim 2, wherein said resistors are made of low-doped polysilicon.

4. The method as claimed in claim 1, wherein the temperature of said integrated circuit is raised to a range between 140° C. and 160° C., and said bias voltage is about 2 V.

5. The method as claimed in claim 1, wherein said determined time interval is between 1 hour and 3 hours.

6. The method as claimed in claim 1, wherein the initial threshold voltage is measured at room temperature before said method is carried out, and when the steps of said method are completed, said integrated circuit is heated for a recovery time interval to diffuse the ions out of said gate oxide layer, and then the final threshold voltage is measured at room temperature and compared with said initial threshold voltage to show the recovery ability of said MOS transistor after being contaminated by ions.

7. The method as claimed in claim 6, wherein said recovery time interval is in the range between 9 and 11 hours.

* * * * *